(12) United States Patent
Kimura

(10) Patent No.: US 7,173,559 B2
(45) Date of Patent: Feb. 6, 2007

(54) REMOTE CONTROLLER

(75) Inventor: Akira Kimura, Ibaraki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/553,065

(22) PCT Filed: Dec. 20, 2004

(86) PCT No.: PCT/JP2004/019483

§ 371 (c)(1),
(2), (4) Date: Oct. 12, 2005

(87) PCT Pub. No.: WO2005/064792

PCT Pub. Date: Jul. 14, 2005

(65) Prior Publication Data

US 2006/0215065 A1    Sep. 28, 2006

(30) Foreign Application Priority Data

Dec. 25, 2003   (JP) .............................. 2003-429439

(51) Int. Cl.
   *G08C 19/12*   (2006.01)
   *H04L 17/02*   (2006.01)
(52) U.S. Cl. ..................... 341/176; 341/175; 345/169
(58) Field of Classification Search ............... 341/176, 341/175; 345/169; 348/734
See application file for complete search history.

(56) References Cited

U.S. PATENT DOCUMENTS 5,327,160 A    7/1994  Asher
6,538,556 B1 * 3/2003  Kawajiri ................... 340/3.2
6,822,634 B1 * 11/2004 Kemp et al. ................ 345/156
7,079,115 B2 * 7/2006  Arnold ..................... 345/161

FOREIGN PATENT DOCUMENTS

| DE | 44 00 668 A1 | 1/1994 |
| EP | 0 763 893 A1 | 3/1997 |
| JP | 7-30972 A    | 1/1995 |
| JP | 7-107567 A   | 4/1995 |
| JP | 11-312441 A  | 11/1999 |
| WO | WO 96/27968  | 9/1996 |

OTHER PUBLICATIONS

International Search Report for PCT/JP2004/019483, dated Apr. 29, 2005.

* cited by examiner

*Primary Examiner*—Timothy Edwards, Jr.
(74) *Attorney, Agent, or Firm*—RatnerPrestia

(57) ABSTRACT

A remote controller includes: a switch for selecting one of a plurality of options in one dimension out of control items laid out in a plurality of dimensions, an item selector for selecting one of a plurality of options in another dimension out of the control items laid out in the plurality of dimensions. The remote controller transmits a remote control code in accordance with an output of the switch and an output of the item selector. The device to be controlled by the remote controller is provided with a display for showing the control items in accordance with a signal from the remote controller. Every time the first remote control code is transmitted, the display displays control items selectable by the item selecting means for a certain period of time.

7 Claims, 2 Drawing Sheets

REMOTE CONTROLLER

THIS APPLICATION IS A U.S. NATIONAL PHASE APPLICATION OF PCT INTERNATIONAL APPLICATION PCT/JP2004/019483.

TECHNICAL FIELD

The present invention relates to a remote controller and a device to be controlled by the remote controller.

BACKGROUND ART

With the start of satellite digital broadcasting and terrestrial digital broadcasting, multi-channel and multifunction are advancing. Television receivers and integrated receivers decoders (IRDs) that receive these broadcasts are operated by remote controllers with buttons. The number of the buttons has been increasing. This tendency is seen not only in the television receivers and integrated receivers decoders (IRDs) but also in various other devices. As the result of the increased number of buttons, remote controllers have poor usability, forcing users to manipulate with both hands while looking at the buttons on the remote controllers.

To solve this, the conventional approaches are all to determine a remote control code to be transmitted by a combination of a plurality of switches on the remote controller side and then to transmit the remote control code determined. Such conventional techniques are disclosed, e.g. in Japanese Patent Laid-Open Application Nos. H11-312441, H07-107567 and H07-30972.

DISCLOSURE OF THE INVENTION

A remote controller comprises:

a switching means for selecting one of a plurality of options in one dimension out of control items laid out in a plurality of dimensions; and an item selecting means for selecting one of a plurality of options in another dimension out of the control items laid out in the plurality of dimensions, wherein a remote control code in accordance with an output of the switching means and an output of the item selecting means is transmitted.

A device to be controlled by the aforementioned remote controller comprises a displaying means for showing control items in accordance with a signal from the remote controller, Wherein every time the first remote control code is transmitted, the displaying means displays control items selectable by the item selecting means for a certain period of time.

DETAILED DESCRIPTION OF THE PREFERRED EMBODIMENTS

Although these conventional solution approaches have reduced the number of buttons on a remote controller, thus simplifying manipulation, the problem still remains that the user must manipulate while looking at the buttons on the remote controller.

The present invention has an object of providing a remote controller allowing the user to manipulate with one hand without looking at the buttons on the remote controller so as to operate a television receiver.

The present invention will be described with the following embodiments.

(Exemplary Embodiment 1)

Figure 1:
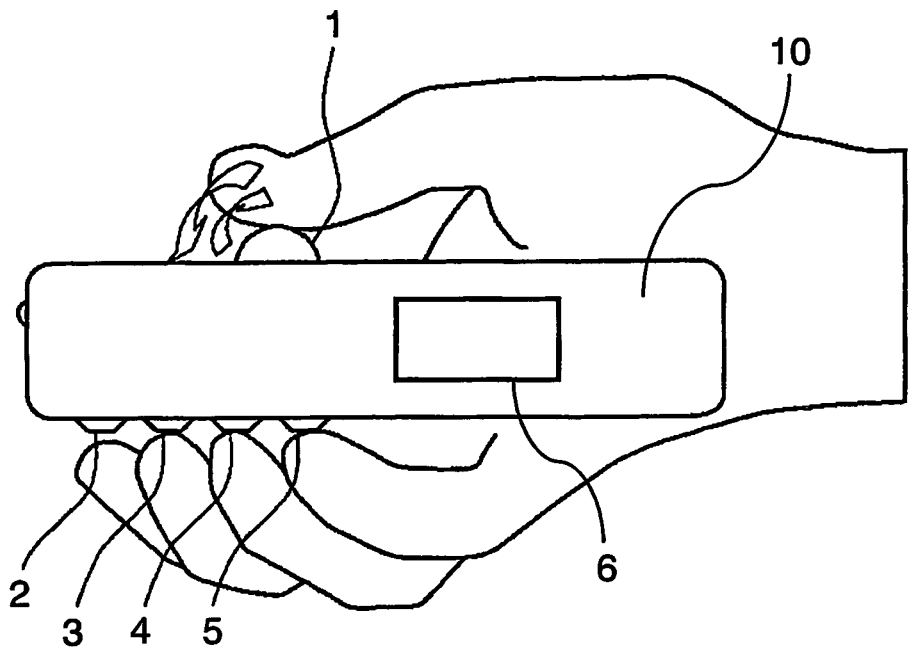
FIG. 1 is a block diagram of a remote controller according to an embodiment of the present invention.

FIG. 1 is a block diagram of a remote controller according to an embodiment of the present invention. In FIG. 1, remote controller 10 is provided with rotary selector switch 1 and item selector buttons 2, 3, 4 and 5. Display 6 will be described later.

Rotary selector switch 1 is an example of a selecting means. The selecting means is not limited to rotary selector switch 1 but can be a switch capable of selecting one of a plurality of options. Rotary selector switch 1 passes through a plurality of contact points in one turn, and every time it contacts with a contact point, rotary selector switch 1 transmits a predetermined signal or first remote control code assigned to the contact point. Item selector buttons 2, 3, 4 and 5 are an example of an item selecting means. The item selecting means is not limited to item selector buttons 2, 3, 4 and 5 but can be a switch capable of selecting one of a plurality of options.

Figure 2:
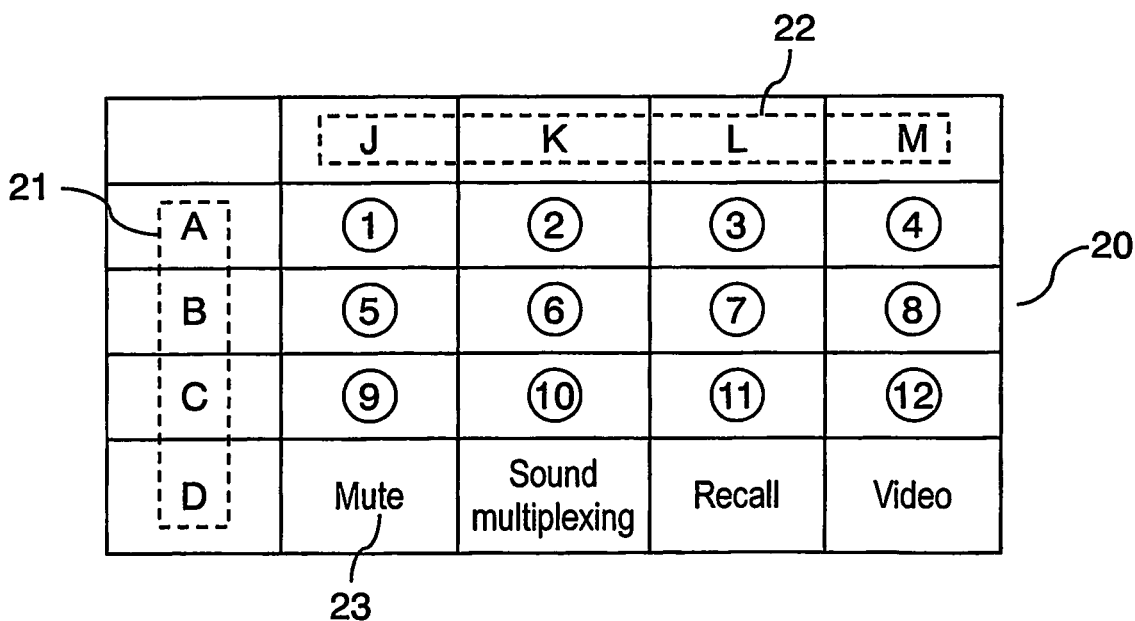
FIG. 2 is a view showing a two-dimensional layout of functions to be selected by a rotary selector switch on the remote controller according to the embodiment of the present invention.

FIG. 2 shows a relation between remote control codes to be generated by rotary selector switch 1, item selector buttons 2, 3, 4 and 5 and control items to be controlled by the remote controller. Remote controller 10 is a means for selecting items on the vertical axis of a table in which the functions of a device such as a television receiver are laid out two dimensionally. These selected items are stored on the receiving side of the remote control codes, and a specified control of the television receiver is performed in accordance with a combination of a first remote control code and a second remote control code.

In FIG. 2, control item table 20 contains control items which are laid out two dimensionally and are controlled by the remote controller. The item on vertical axis 21 is determined by rotary selector switch 1, and a predetermined signal is transmitted as the first remote control code in accordance with the determination. The item on horizontal axis 22 is determined by item selector buttons 2, 3, 4 and 5, and a predetermined signal is transmitted as the second remote control code in accordance with the determination.

Pushing item selector button 2 designates "J"; pushing item selector button 3 designates "K"; pushing item selector button 4 designates "L"; and pushing item selector button 5 designates "M". Thus, the second remote control codes dedicated to the respective item selector buttons are transmitted.

When received one of the codes "J" through "M" as the second remote control code, the television receiver combines the code with the one received last of "A" through "D" as the first remote control code. Then, remote controller 10 specifies the function to operate the television receiver, thus operating the television receiver.

Here, for example when rotary selecting switch 1 is manipulated to generate the first remote control code that designates "D" on vertical axis 21, and item selector button 2 is manipulated to generate the second remote control code that designates "J" on the horizontal axis, remote controller 10 controls the television receiver so that "Mute" is executed.

Figure 3:
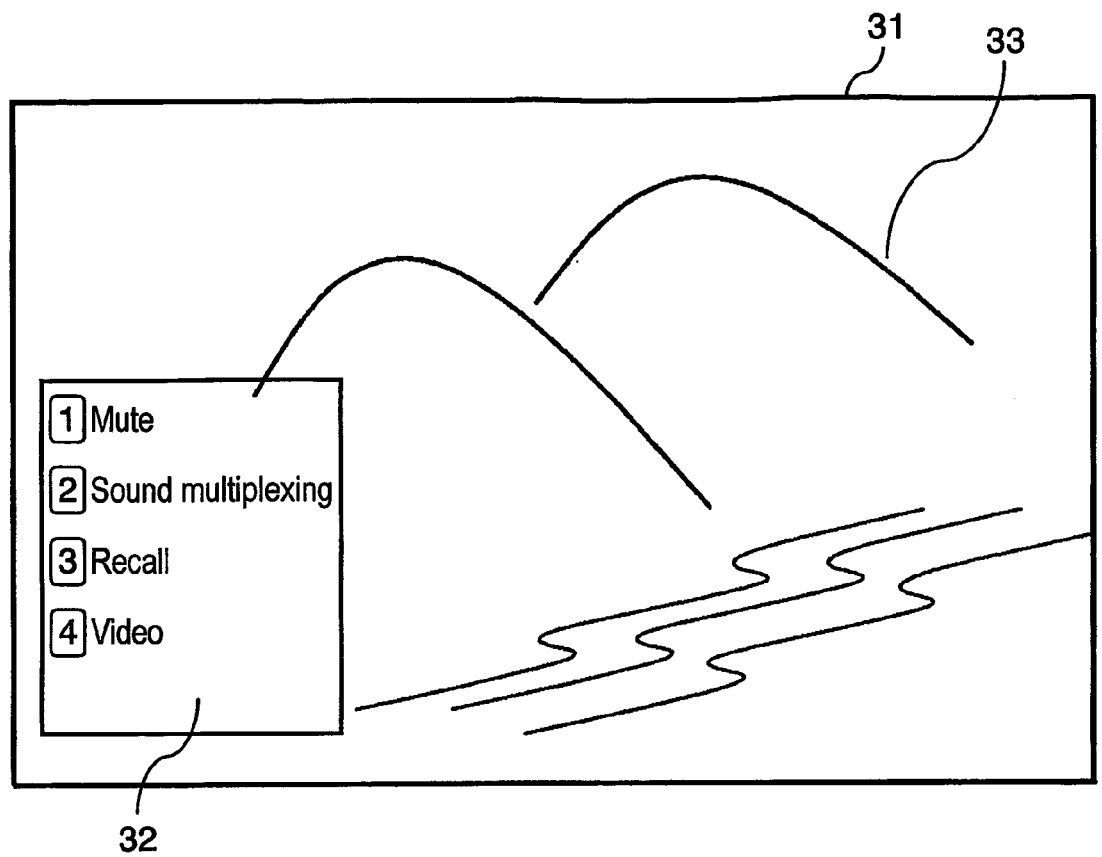
FIG. 3 is a view showing a display example on a television receiver according to the embodiment of the present invention.

FIG. 3 is a display example on a display of the television receiver. Display 31 of the television receiver shows image 33 which is being received. When the television receiver is controlled by remote controller 10, control items 32 are also displayed on display 31. To display control items 32 on display 31 is an example of a displaying means for displaying the control items.

Every time a first remote control code is transmitted by turning rotary selector switch 1, items selectable in accordance with the transmitted first remote control code are shown in control items 32. FIG. 3 shows a case where "Mute", "Sound multiplexing", "Recall" and "Video" are shown as control items 32. This is a case where the position on vertical axis 21 in FIG. 2 is determined by rotary selecting switch 1, and the control items in the horizontal axis corresponding to the position are "Mute", "Sound multiplexing", "Recall" and "Video".

It is also possible to let the aforementioned control items 32 be displayed on remote controller 10. In FIG. 1, display 6 displays information corresponding to control items 32 of FIG. 3. Remote controller 10 displays the control items on display 6 so that the user can check the control items close at hand. Display 6 has a function to show selection status when the user can not recognize the selection status. To display control items on display 6 is other example of the displaying means for showing the control items.

Figure 4:
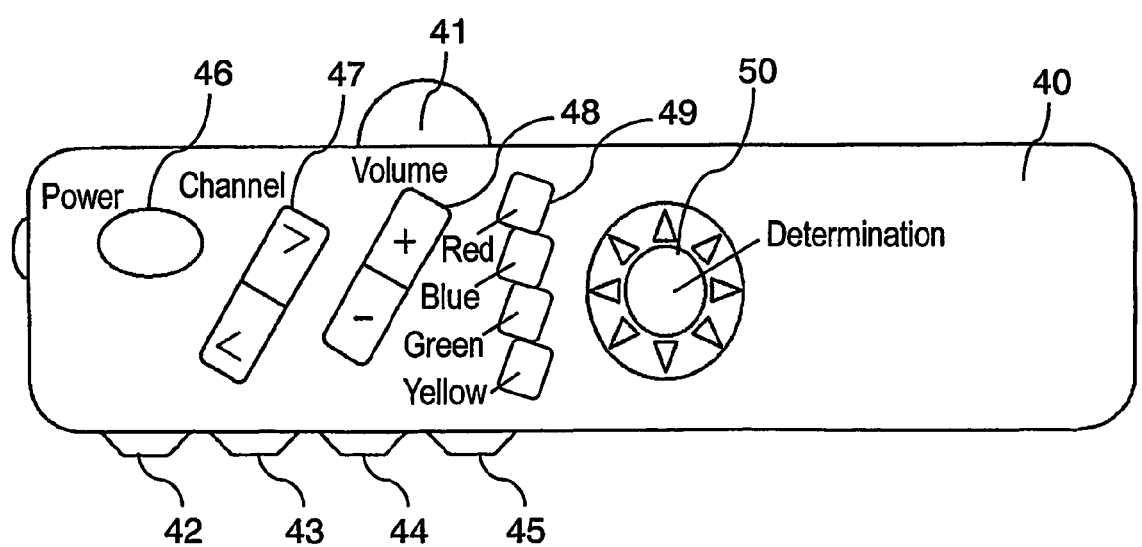
FIG. 4 is a view showing another embodiment according to the present invention which is intended to represent the general use of the remote controller.

The present invention is not limited to the remote controller that performs only the aforementioned two operations. The remote controller shown in FIG. 1 may be combined with the conventional remote control system which operates one function by one key. FIG. 4 shows a remote controller structured by combining the system shown in FIG. 1 with the conventional remote control system which operates one function by one key.

In FIG. 4, remote controller 40 is provided with rotary selector switch 41, item selector buttons 42, 43, 44 and 45, power button 46, channel selector button 47, volume button 48, color selector button 49 and determination button 50. Rotary selector switch 41 looks similar and has similar functions to rotary selector switch 4 shown in FIG. 1. Item selector buttons 42, 43, 44 and 45 look similar and have similar functions to item selector buttons 2, 3, 4 and 5, respectively.

Power button 46 is a button to control the power on/off of the television receiver similarly to the power button of the conventional remote controller. Channel selector button 47 is a button to control the channel selection of the television receiver similarly to the channel selector button of the conventional remote controller. Volume button 48 is a button to control the volume of the television receiver similarly to the volume button of the conventional remote controller. Color selector button 49 is a button to specify the selection on the screen at data broadcasting and the like similarly to the color selector button of the conventional remote controller. Determination button 50 is a button to make various determinations similarly to the determination button of the conventional remote controller.

The description above deals with a case where the control items to be controlled by remote controller 10 are laid out two dimensionally. In FIG. 2, the item on vertical axis 21 is determined by rotary selector switch 1 so as to transmit the first remote control code, and the item on horizontal axis 22 is determined by item selector buttons 2, 3, 4 and 5 so as to transmit the second remote control code. The present invention is not limited to the case where the control items are laid out two dimensionally as shown in FIG. 2 but may have a multidimensional or hierarchical structure.

It is preferable that the number of the item selector buttons as an item selecting means be kept within easy manipulation with one hand, and that the function do not start until an item selector button is pushed. It is also possible to have a structure in which the item on the vertical axis selected by the rotary selector switch as a switching means is stored in memory.

The description above deals with a case where the device to be controlled is a television receiver; however, the device to be controlled by the remote controller according to the present invention is not limited to the television receiver. The same effects could be obtained when the remote controller according to the present invention is used to control an integrated receiver decoder (IRD), an audio device or any other device provided with a display part. Thus, the present invention is applicable to various product fields besides household electric appliances.

As apparent from the description hereinbefore, the present invention can provide a remote controller allowing the user to manipulate with one hand without looking at the buttons on the remote controller. The present invention can also provide a device which has good operability and is controlled by the aforementioned remote controller.

INDUSTRIAL APPLICABILITY

The remote controller according to the present invention allows the user to manipulate with one hand without looking at the buttons on the remote controller, thus being applicable to various other product fields besides household electric appliances which are having more and more functions every year.

The invention claimed is:

1. A remote controller comprising:
    a switch for selecting one of a plurality of options in one dimension out of control items laid out in a plurality of dimensions; and
    an item selector for selecting one of a plurality of options in another dimension out of the control items laid out in the plurality of dimensions,
    wherein a remote control code in accordance with an output of the switch and an output of the item selector is transmitted.

2. The remote controller according to claim 1,
    wherein the switch outputs a first remote control code and the item selector outputs a second remote control code.

3. The remote controller according to claim 1 further comprising:
    a determiner for determining the remote control code in accordance with the output of the switch and the output of the item selector.

4. The remote controller according to claim 2,
    wherein the switch passes through a plurality of contact points in one turn, and
    every time the switch contacts one of the plurality of contact points, the switch outputs the first remote control code assigned to the one of the plurality of contact points.

5. The remote controller according to claim 2 further comprising:
   a display for displaying the control items.
6. The remote controller according to claim 5, wherein every time the first remote control code is transmitted, the display displays control items selectable by the item selector for a certain period of time.
7. A device comprising a display for displaying control items in accordance with a signal from the remote controller, a remote controller comprising:
   a switch for selecting one of a plurality of options in one dimension out of control items laid out in plurality of dimensions; and
   an item selector for selecting one of a plurality of options in another dimension out of the control items laid out in the plurality of dimensions
   wherein a remote control code in accordance with an output of the switch and an output of the item selector is transmitted,
   wherein the switch outputs a first remote control code and the item selector outputs a second remote control code,
   wherein every time the first remote control code is transmitted, the display displays control items selectable by the item selector for a certain period of time.

* * * * *

UNITED STATES PATENT AND TRADEMARK OFFICE
CERTIFICATE OF CORRECTION

PATENT NO. : 7,173,559 B2
APPLICATION NO. : 10/553065
DATED : February 6, 2007
INVENTOR(S) : Akira Kimura It is certified that error appears in the above-identified patent and that said Letters Patent is hereby corrected as shown below:

Column 5
Line 12, after "in" add -- a --

Column 6
Line 3, after "dimensions" add -- , --

Signed and Sealed this

Nineteenth Day of June, 2007

JON W. DUDAS
*Director of the United States Patent and Trademark Office*